(12) United States Patent
Tanaka et al.

(10) Patent No.: US 8,974,680 B2
(45) Date of Patent: Mar. 10, 2015

(54) PATTERN FORMING METHOD

(75) Inventors: Hiroki Tanaka, Fuchu (JP); Ryosuke Yamamoto, Kawasaki (JP); Naoko Kihara, Matsudo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/426,166

(22) Filed: Mar. 21, 2012

(65) Prior Publication Data

US 2012/0228262 A1 Sep. 13, 2012

Related U.S. Application Data

(63) Continuation of application No. PCT/JP2009/066700, filed on Sep. 25, 2009.

(51) Int. Cl.
| | |
|---|---|
| *H01L 21/302* | (2006.01) |
| *H01L 21/461* | (2006.01) |
| *C03C 15/00* | (2006.01) |
| *C03C 25/68* | (2006.01) |
| *B44C 1/22* | (2006.01) |
| *C08F 2/00* | (2006.01) |
| *C08F 4/00* | (2006.01) |

(Continued)

(52) U.S. Cl.
CPC .............. *G11B 5/82* (2013.01); *H01L 21/3081* (2013.01); *B81C 1/00031* (2013.01); *B81C 2201/0149* (2013.01); *H01L 21/3086* (2013.01); *B82Y 10/00* (2013.01); *G11B 5/743* (2013.01); *G11B 5/855* (2013.01)
USPC .................... 216/33; 216/38; 216/52; 216/53; 216/88; 216/89; 438/689; 438/690; 438/691; 438/692; 438/693; 526/89; 526/213; 526/210; 526/222; 526/291; 528/10; 528/271

(58) Field of Classification Search
None
See application file for complete search history.

(56) References Cited

U.S. PATENT DOCUMENTS

| 5,948,470 A | 9/1999 | Harrison et al. |
|---|---|---|
| 6,054,507 A | 4/2000 | Fukani et al. |

(Continued)

FOREIGN PATENT DOCUMENTS

| JP | 5-287084 | 11/1993 |
|---|---|---|
| JP | 2001-151834 | 6/2001 |

(Continued)

OTHER PUBLICATIONS

F.S. Bares et al., "Block Copolymer Thermodynamics: Theory and Experiment", Annu. Rev. Phys. Chem., vol. 41, pp. 525-557.

(Continued)

*Primary Examiner* — Nadine G Norton
*Assistant Examiner* — Stephanie Duclair
(74) *Attorney, Agent, or Firm* — Nixon & Vanderhye P.C.

(57) ABSTRACT

A pattern forming method includes forming a coating film containing a hydrophilic first homopolymer having a first bonding group and a hydrophobic second homopolymer having a second bonding group capable of bonding with the first bonding group, forming a bond between the first and second bonding group to produce a block copolymer of the first and second homopolymers, and heating the coating film to microphase-separating the copolymer into a hydrophilic domain and a hydrophobic domain. The hydrophilic and hydrophobic domains are arranged alternately. The bond is broken, then selectively dissolving-removing either domain by a solvent to provide a polymer pattern of a remainder domain.

18 Claims, 5 Drawing Sheets

(51) Int. Cl.
  *G11B 5/82* (2006.01)
  *H01L 21/308* (2006.01)
  *B81C 1/00* (2006.01)
  *B82Y 10/00* (2011.01)
  *G11B 5/74* (2006.01)
  *G11B 5/855* (2006.01)

(56) References Cited

U.S. PATENT DOCUMENTS

| 7,097,781 B2 | 8/2006 | Asakawa et al. | |
| 2002/0133072 A1* | 9/2002 | Wang et al. | 600/423 |
| 2008/0041818 A1* | 2/2008 | Kihara et al. | 216/41 |
| 2008/0193658 A1* | 8/2008 | Millward | 427/401 |

FOREIGN PATENT DOCUMENTS

| JP | 2002-60519 | 2/2002 |
| JP | 2002-279616 | 9/2002 |
| JP | 2006-299106 | 11/2006 |
| JP | 2008-36491 | 2/2008 |
| JP | 2008-43873 | 2/2008 |
| JP | 2008-189910 | 8/2008 |

OTHER PUBLICATIONS

English-language translation of International Preliminary Report on Patentability for PCT/JP2009/066700 dated Apr. 19, 2012.

* cited by examiner

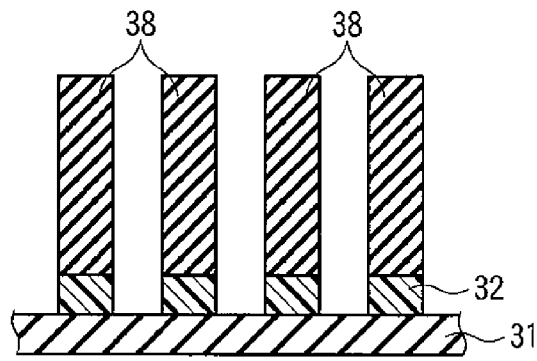
F I G. 12
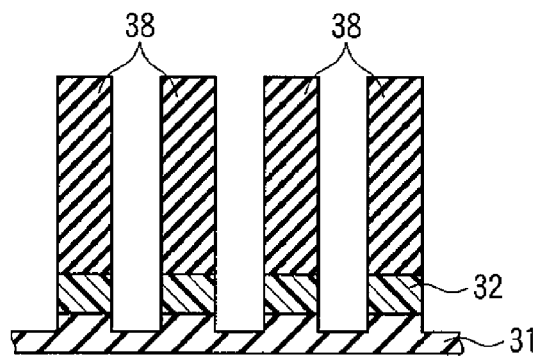
F I G. 13
F I G. 14

PATTERN FORMING METHOD

CROSS REFERENCE TO RELATED APPLICATIONS

This application is a Continuation Application of PCT Application No. PCT/JP2009/066700, filed Sep. 25, 2009, the entire contents of which are incorporated herein by reference.

FIELD

Embodiments described herein relate generally to a pattern forming method.

BACKGROUND

The miniaturization of semiconductor devices and the like has been achieved using an exposure light source having a shorter wavelength in lithography. Artificially assisted self-assembling (AASA) method, in which the array of a pattern is controlled using a phase separation phenomenon of a block copolymer, is proposed as a method to obtain a fine polymer pattern with a high throughput at a lower cost (see, for example, U.S. Pat. No. 5,948,470).

A method of producing a recording medium using the obtained polymer pattern is also proposed (see, for example, JP-A 2002-279616 (KOKAI)). Although the polymer pattern is used as an etching mask, it becomes difficult to obtain a structure accurately corresponding to the phase-separated structure if the pattern size is reduced. The orderliness of the processed pattern is deteriorated by the generated size variation. Dyeing and dry etching steps are required, leading to increase in the number of process steps and in cost.

BRIEF DESCRIPTION OF THE DRAWINGS

FIG. 12 is a sectional view showing a step next to the step shown in FIG. 11;

FIG. 13 is a sectional view showing a step next to the step shown in FIG. 12; and FIG. 14 is a sectional view showing a step next to the step shown in FIG. 13.

DETAILED DESCRIPTION

In general, according to one embodiment, a pattern forming method comprises forming, on a substrate, a coating film containing a hydrophilic first homopolymer having a first bonding group at its terminal and a hydrophobic second homopolymer having, at its terminal, a second bonding group capable of bonding with the first bonding group; forming a bond between the first bonding group and the second bonding group to produce a block copolymer containing the first and second homopolymners; and heating the coating film to microphase-separating the block copolymer into a hydrophilic domain containing the first homopolymer and a hydrophobic domain containing the second homopolymer. The hydrophilic domain and the hydrophobic domain are arranged alternately side by side. Then, the bond is broken. Then, selectively dissolving and removing either the hydrophilic domain or the hydrophobic domain using a solvent to provide a polymer pattern constituted of a remainder domain.

Embodiments of the present invention will be explained.

When two or more types of homopolymers are mixed, a uniformly mixed state is rarely obtained. Different homopolymers repel each other, with the result that the same types of homopolymers coagulate to cause phase separation. Even in the case of block copolymers, chemically bonded different polymers repel each other to cause phase separation. Because different homopolymers are chemically bonded in the block copolymer molecule, the size of the phase cannot be increased. The size of the phase is almost the same as a free radius $R_g$ of gyration of a block copolymer. This phase separation of a block copolymer is the microphase separation in which separated phases are formed at a pitch of about several nanometers to 100 nanometers.

The shape of microphase-separated domains is largely depends on the degree of polymerization of the block copolymer, on the chemical nature of each block chain (segment), and on the volume percentage of each block chain. The microphase separation of a diblock copolymer will be explained with reference to FIG. 1.

Figure 1:
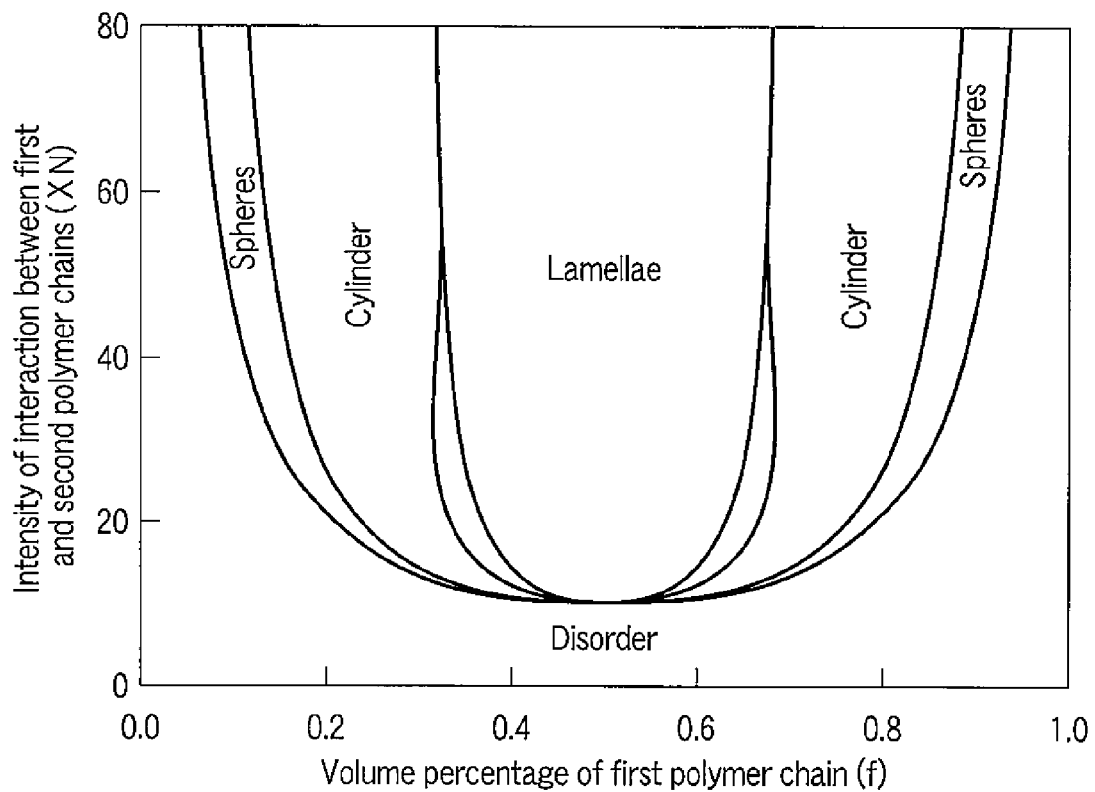
FIG. 1 is a phase diagram showing the state of microphase separation.

In FIG. 1, the abscissa is the volume percentage f of a first polymer chain (segment) and the ordinate is the product $\chi N$ of the interaction parameter $\chi$ between first and second polymer chains (segments) with the degree N of polymerization of the block copolymer. As the value of $\chi$ increases, the compatibility of the first and second polymer chains is lowered, bringing about easy phase separation. Further, phase separation is caused more easily with increase in the degree N of polymerization. Therefore, the product $\chi N$ is frequently used as an index of easiness of phase separation and the phase separation is caused more easily with increase in the value of $\chi N$. When the value of $\chi N$ becomes too small, on the other hand, no phase separation can be exhibited, leading to a disordered state. It is known that, generally, when the value of $\chi N$ is 10 or less, the block polymer is put into a disordered state.

In F. S. Bates et al., Annu. Rev. Phys. Chem., vol. 41, pp. 525-557, the pitch $L_0$ of phase separation is given by the equation: $L_0 \sim aN^{2/3}\chi^{1/6}$. The pattern size is defined by the length a of segments of a block copolymer, the degree N of polymerization of the block copolymer and $\chi$ parameter. As long as the phase separation of the block copolymer stably occurs, a fine pattern can be obtained by varying the degree of polymerization and/or the type of polymer.

Figure 2:
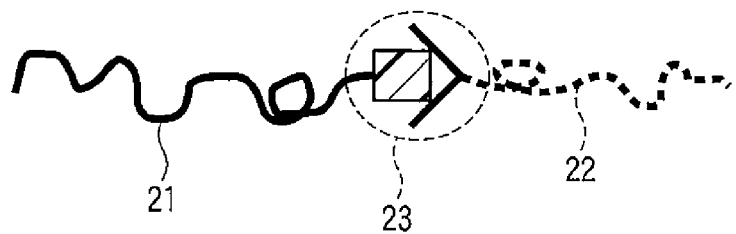
FIG. 2 is a typical view showing the bonding state between a first polymer chain and a second polymer chain.

The block copolymer producing a microphase-separated structure in an embodiment has a fundamental structure in which a first homopolymer chain (segment) 21 and a second homopolymer chain (segment) 22 are bonded at 23 as shown in FIG. 2. The bond 23 between the first homopolymer chain 21 and the second homopolymer chain 22 is formed by bonding the first bonding group at the terminal of the first polymer chain 21 with the second bonding group at the terminal of the second polymer chain 22. The bond between the bonding groups is formed by dehydration condensation, $S_N2$ reaction or the like.

It is necessary that the bond 23 can be broken by an acid, base, light or heat. Examples of the bond include an acetal bond formed by the reaction between a carbonyl group and an alcohol or diol, ether bond formed by the reaction between a hydroxyl group and methoxymethyl ether chloride, silyl ether bond formed by the reaction between a hydroxyl group and silyl chloride derivative, ester bond formed by the reaction between a carboxyl group and an alcohol, and amide bond formed by the reaction between an amino group and a carboxyl group. These bonds can be broken by an acid.

Examples of the bond broken by a base include ester bonds formed by the reaction between a hydroxyl group and acetic acid anhydride derivative or benzoyl chloride derivative.

A combination of the first bonding group and second bonding group is selected such that a desired bond is obtained and each bonding group is combined with a proper polymer chain to prepare a first homopolymer and a second homopolymer.

The combination of the first homopolymer chain and second homopolymer chain can be selected in the following manner. It is known that in two types of polymer chains, the square of a difference between solubility parameters has an influence on the interaction parameter χ between the polymers. For this, it suffices to provide a combination of the first polymer chain with the second polymer chain such that a difference in the solubility parameters corresponding to a desired pattern size may be obtained. Further, it is necessary to select the degree of polymerization of the homopolymer chain (segment) and length of the segment corresponding to a desired pattern size. However, a difference in solubility parameters between the first homopolymer and the second homopolymer is required to form a pattern.

In an embodiment, it is required that the first homopolymer be hydrophilic and the second homopolymer be hydrophobic. No particular limitation is imposed on the combination of the bonding group and the homopolymer chain as long as the above requirement is satisfied.

As the homopolymer chain, a polydiene polymer chain, polyalkene polymer chain, polyacrylate polymer chain, polymethacrylate polymer chain, styrene-based polymer chain, polysiloxane chain, or the like may be used.

Specific examples of the polydiene polymer chain include a poly(1,2-butadiene), poly(1,3-butadiene), poly(chloroprene), poly(1,4-cis-isoprene) and poly(isobutylene).

Specific examples of the polyalkene polymer chain include a poly(ethylene), poly(isobutene), poly(propylene) and poly(2-methylpropene).

Examples of the polyacrylate polymer chain include a poly(methylacrylate), poly(ethylacrylate), poly(t-butylacrylate), poly(n-butylacrylate), poly(neopentylacrylate), poly(n-nonylacrylate), poly(n-octylacrylate), poly(2-ethylhexylacrylate), poly(1-ethoxyethylacrylate) and poly(hydroxyethylacrylate).

Specific examples of the polymethacrylate polymer chain include a poly(methylmethacrylate), poly(ethylmethacrylate), poly(n-propylmethacrylate), poly(n-butylmethacrylate), poly(t-butylmethacrylate), poly(neopentylmethacrylate), poly(cyclohexylmethacrylate), poly(2-hydroxyethylmethacrylate), poly(2-hydroxypropylmethacrylate) and poly(trifluoroethylmethacrylate).

Specific examples of the styrene-based polymer chain include a polystyrene, poly(α-methylstyrene), poly(2-vinylpyridine), poly(4-vinylpyridine), poly(4-hydroxystyrene), poly(t-butylstyrene), poly(t-butoxystyrene), poly(4-aminomethylstyrene), poly(4-methyoxystyrene) and poly(p-chloromethylstyrene).

Specific examples of the polysiloxane chain include a poly(dimethylsiloxane), poly(diphenylsiloxane) and poly(methylphenylsiloxane).

Moreover, a poly(ferrocenyldimethylsilane), polyacrylonitrile, polyacrylamide, poly(N,N-dimethylacrylamide), poly(vinylalcohol), poly(4-vinylphenol), poly(vinyl acetate), poly(vinyl chloride), poly(vinyl bromide), poly(tetrafluoroethylene), poly(ε-caprolactone), poly(ethylene oxide), poly(propylene oxide), polyacrylic acid, or polymethacrylic acid may be used.

Examples of the hydrophilic polymer chain include a polyethylene oxide, polymethylmethacrylate, polyvinyl alcohol, polyacrylonitrile, and polypropylene. Examples of the hydrophobic polymer chain include a polystyrene, polyethylene, polyisoprene, and polydimethylsiloxane.

The weight average molecular weight of each of the first and second homopolymers is preferably 1000 to 200000, though no particular limitation is imposed on the weight average molecular weight. The volume ratio may be selected according to the morphology of intended phase separation based on the phase diagram of the volume ratio as shown in FIG. 1 and molecular weight.

The first homopolymer and the second homopolymer are dissolved in a solvent to obtain a blend polymer solution. The blending ratio of the first homopolymer to second homopolymer may be appropriately selected according to, for example, the structure and the pitch of an intended phase separation. For example, the ratio by weight of the first homopolymer to the second homopolymer may be about 20:80 to 40:60. As the solvent, water, an alcohol-type solvent, ester-type solvent, ketone-type solvent, cellosolve-type solvent, ether-type solvent, aromatic solvent and the like may be used.

Examples of the alcohol-type solvent include methanol, ethanol, and 2-propanol. Examples of the ester-type solvent include ethyl acetate, ethyl lactate, butyl acetate, isoamyl acetate, γ-butyrolactone, methyl 3-methoxypropionate and diethyl carbonate.

Examples of the ketone-type solvent include cyclopentanone, cyclohexanone, acetone, methyl ethyl ketone and methyl isobutyl ketone. Examples of the cellosolve-type solvent include methylcellosolve, methylcellosolve acetate, ethylcellosolve acetate, and butylcellosolve acetate.

Examples of the ether-type solvent include diethylene glycol dimethyl ether and ethylene glycol monomethyl ether. Examples of the aromatic solvent include toluene, xylene, anisole, tetralin, and tetramethylbenzene.

Moreover, propylene glycol monoethyl acetate (PGMEA) and the like may be used.

Solvents such as those mentioned above may be used singly or as a mixed solvent containing two or more of these solvents. It is preferable to select a proper solvent to satisfactorily dissolve a blend polymer containing the first and second homopolymers. The concentration of the polymers in the solution is usually about 1 to 10% by weight, though it is selected corresponding to coating conditions.

Figure 3:
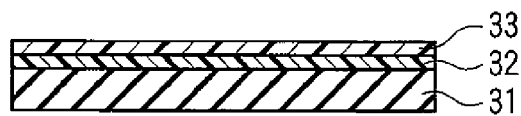
FIG. 3 is a sectional view showing a step of a pattern forming method according to an embodiment.

The blend polymer solution is applied to the surface of the substrate 31 to obtain a coating film 33 as shown in FIG. 3. The material of the substrate 31 may be a metal, semiconductor or insulating material without any particular limitation. The substrate 31 is preferably made of an Si substrate in which a flat area exists.

It is desired to dispose an undercoat layer 32 between the substrate 31 and the coating film 33. This undercoat layer 32 has the ability to promote vertical stacking of the homopolymer segments in the coating film 33 and is called a neutralization film. The undercoat layer 32 may be formed by treating the surface of the substrate with the polymer having a hydroxyl group at its terminal.

Because the Si substrate is provided with a natural oxide film on its surface, a hydroxyl group exists on the surface of the substrate 31. A hydroxyl group on the surface of the substrate is bonded with a hydroxyl group at the terminal of the polymer in the undercoat layer 32 by dehydration condensation. The polymer used for forming the undercoat layer 32 preferably has an energy state having a middle surface energy between the surface energies of the polymers constituting a diblock copolymer in the coating film 33 formed on the undercoat layer. This is because it is intended to secure predetermined vertical stacking of the homopolymer chain.

The polymer used to form the undercoat layer 32 may be properly selected corresponding to the type of diblock copolymer. In the case of, for example, a diblock copolymer containing a polystyrene and polyethylene oxide, a random copolymer of a polystyrene and a polymethylmethacrylate may be used to form the undercoat layer 32. A predetermined polymer is dissolved in a solvent such as toluene to prepare an approximately 1-wt % solution. This solution is applied to the substrate 31, which is then heated to 140° C. so that it undergoes dehydration-condensation between the surface of the substrate and the polymer. Then, the substrate is washed with toluene to remove unreacted polymer, thereby forming the undercoat layer 32 on the surface of the substrate 31. It may be said that the surface of the substrate 31 is modified by carrying out this treatment.

In the formation of the coating film 33 on the undercoat layer 32, the blend polymer solution may be applied by an optional method. General examples of the coating method include spin coating, roller coating, dip coating, brush coating, spray coating and curtain coating methods. A spin coating method is desirable because a highly uniform film thickness is obtained.

The first bonding group at the terminal of the first homopolymer is bonded with the second bonding group at the terminal of the second homopolymer by heating the coating film of the blend polymer. Microphase separation of the block copolymer containing the first homopolymer and second homopolymer occurs to promote the formation of a cylinder-type array. The heat treatment temperature here is higher than the glass transition temperature of the constituent homopolymers and lower than the melting point of the constituent homopolymers. Generally, the heat treatment is carried out at a temperature range from 100 to 300° C. A temperature T2 satisfying the following relationship may be determined as the heat treatment temperature.

$$T1<T2<T3$$

where, T1 represents a temperature at which the above first bonding group is bonded with the above second bonding group and T3 represents a temperature at which the above bond is thermally broken.

The heat treatment time is usually about 12 to 36 hours, though it may be determined corresponding, for example, to the time required for finishing the reaction by which the first bonding group at the terminal of the first homopolymer is bonded with the second bonding group at the terminal of the second homopolymer or to the time required for optimization of the phase-separated structure. When solvent annealing is performed, a pattern having a large area and reduced in defects can be produced.

The bonding group at the terminal of the first homopolymer is bonded with the bonding group at the terminal of the second homopolymer by mixing these homopolymers depending on the situation. When a bonding group having a high bonding temperature is selected, it is desired to carry out heat treatment.

Figure 4:
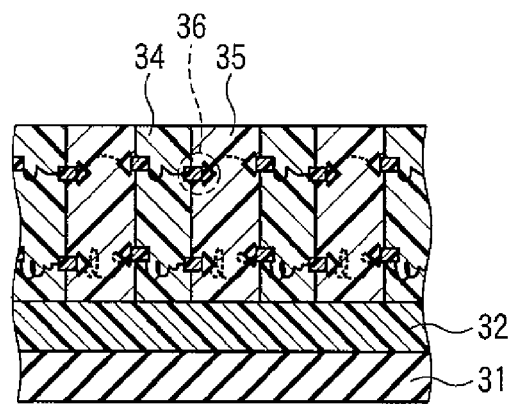
FIG. 4 is a sectional view showing a step next to the step shown in FIG. 3.

In the heat-treated coating film 32, the microphase separation results in the formation of hydrophilic domains 34 each containing the first homopolymer and hydrophobic domains 35 each containing the second homopolymer which are alternately disposed side by side as shown in FIG. 4. A bond 36 is formed between the first homopolymer constituting the hydrophilic domain 34 and the second homopolymer constituting the hydrophobic domain 35. This bond 36 is, as mentioned above, formed by the linkage of the first bonding group at the terminal of the first homopolymer and the second bonding group at the terminal of the second homopolymer.

Figure 5:
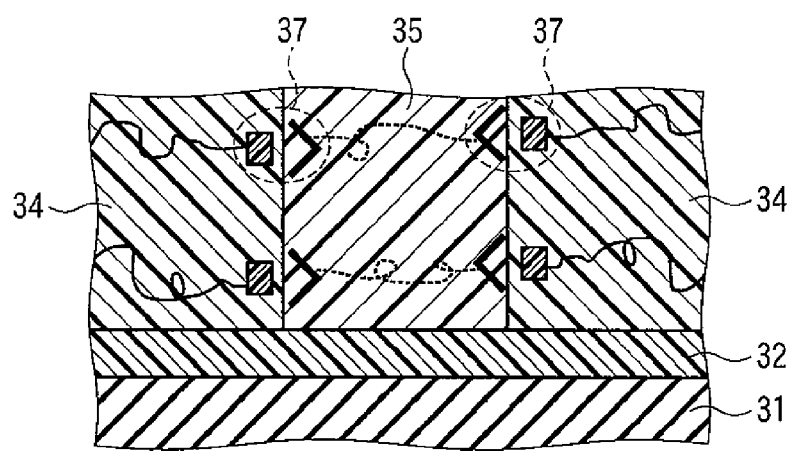
FIG. 5 is an enlarged sectional view showing a step next to the step shown in FIG. 4.

The bond formed between the first homopolymer and the second homopolymer is broken by applying prescribed stimulation as shown in FIG. 5. In FIG. 5, the reference sign 37 represents the broken bond. Examples of the stimulation include an acid, base, light and heat and the bond is selectively broken at the phase separation interface.

In the case where the bond is broken, for example, by an acid, a photoacid generator such as tris(4-methylphenyl)sulfoniumtrifluoromethane sulfonate, tris(4-methylphenyl)sulfoniumhexafluoro phosphate or bis(4-tert-butylphenyl)iodoniumtrifluoromethane sulfonate is previously added to the a blend polymer solution. An acid is generated by radiation of light, which makes possible to break the bond.

Such a photoacid generator may be called a breakage initiator. If the breakage initiator is formulated in an amount of about 20 to 60% based on the total weight of the first homopolymer and second homopolymer, its effect is obtained.

The bond may also be broken by dripping an acid or base solution directly on the block copolymer film after the microphase separation. It is preferable that the solution used be selectively penetrated into domains which are to be dissolved and removed in the subsequent solvent washing. Thus, a polymer pattern having a more precise shape is obtained.

Figure 6:
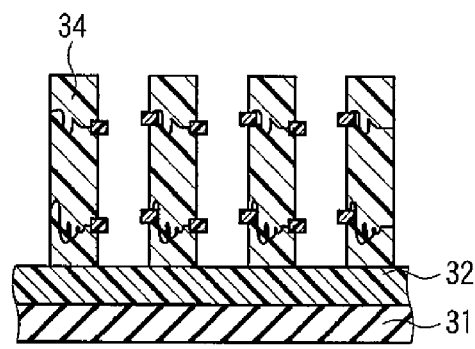
FIG. 6 is a sectional view showing a step next to the step shown in FIG. 5.

After the bond is broken, washing is conduced with a solvent which selectively dissolve the domains of one homopolymer as shown in FIG. 6 to form a polymer pattern. No particular limitation is imposed on the solvent to be used here and a solvent which can satisfactorily dissolve and remove the intended domains may be optionally selected corresponding to the polymer to be removed.

It is preferable to adjust the surface free energy of the surface of the undercoat layer 32 in accordance with the hydrophilic or hydrophobic property of the homopolymer to be left. This can prevent pattern collapse in the solvent washing. The adjustment of the surface free energy is usually made by using a silane coupling agent. Examples of the silane coupling agent include these having a halogen group, alkoxy group or silazane group at each terminal thereof.

In the pattern forming method according to this embodiment, after the first homopolymer is bonded with the second homopolymer, and the phase-separated structure is obtained, the bond at the phase separation interface is broken. Then, the domains constituting one of the homopolymers is dissolved and removed by a solvent to form a polymer pattern. Variances at the phase separation interface are the roughness of the obtained polymer pattern, ensuring that an ordered pattern reduced in variation can be formed.

The polymer pattern is obtained by dissolving and removing either the hydrophilic domains or the hydrophobic domains in the polymer film. When the polymer pattern is formed by dry etching, an etching residue may be generated by local variations of etching speed. In the method of this embodiment, a polymer pattern is formed by dissolving and removing one of these domains by a solvent and therefore, such a problem is avoided.

Because a vacuum process such as dry etching or dyeing process can be omitted, a highly accurate and orderly arranged pattern can be formed with a high throughput at low cost by the method of this embodiment.

In the formed polymer pattern, bonding groups are arranged in line on the surface, and therefore, the surface is improved in wettability to a solvent. No particular limitation is imposed on the solvent which is used in solvent washing and a wide range of solvent may be used. Further, because the molecular weight of the polymer to be eluted is almost uniform and therefore, the solubility of the polymer in a solvent is constant. The dissolution residue can be thereby reduced.

Since predetermined domains are dissolved and removed by a solvent to form a polymer pattern, the surface of the obtained polymer pattern is subjected to hydrophilic treatment by the solvent. When fine dust such as particles adheres to the surface, this dust can also be easily removed by washing with water.

Figure 7:
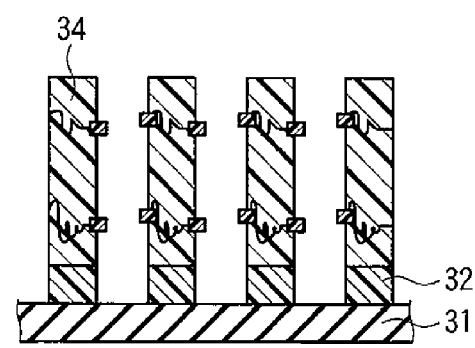
FIG. 7 is a sectional view showing a step next to the step shown in FIG. 6.

Using the left polymer pattern as a mask, the undercoat layer 32 is processed as shown in FIG. 7. When the undercoat layer 32 is made of, for example, a random copolymer of polystyrene and polymethylmethacrylate, etching is carried out by reactive ion etching (RIE) using an etching gas such as $O_2$ and $CF_4$.

Figure 8:
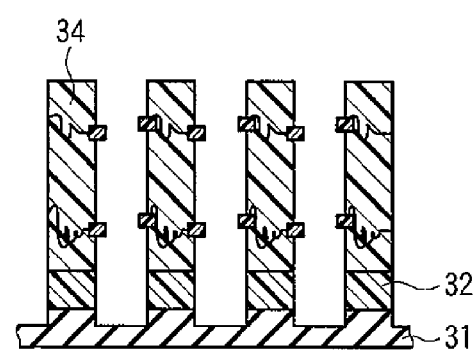
FIG. 8 is a sectional view showing a step next to the step shown in FIG. 7.

The processed undercoat layer 32 and polymer pattern are used as the etching mask to process the substrate 31 as shown in FIG. 8. When the substrate to be processed is, for example, a silicon substrate, etching treatment is performed by RIE using a fluorine-type etching gas such as $CF_4$. The exposed surface of the silicon substrate is thereby etched to transfer an ordered pattern.

Figure 9:
FIG. 9 is a sectional view showing a step next to the step shown in FIG. 8.

After the pattern is transferred to the surface of the substrate, the substrate is washed with a solvent which sufficiently dissolves the undercoat layer 32 and the etching mask is then removed as shown in FIG. 9. At this time, also no particular limitation is imposed on the solvent to be used and an appropriate solvent may be selected from solvents which can satisfactorily dissolve and remove the undercoat layer corresponding to the material of the undercoat layer.

Figure 10:
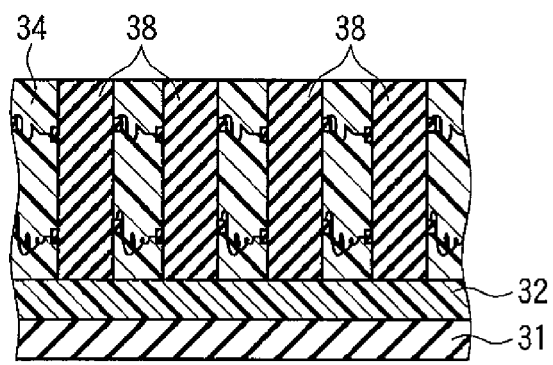
FIG. 10 is a sectional view showing another step next to the step shown in FIG. 6.

When the polymer pattern left on the undercoat layer 32 has only insufficient etching resistance, a reverse pattern may be formed as the etching mask. Specifically, as shown in FIG. 10, an etching-resistant region 38 is formed using a material having high etching resistance. Examples of the material having high etching resistance include SOG (spin-on-glass). SOG has high resistance to oxygen plasma etching.

Figure 11:
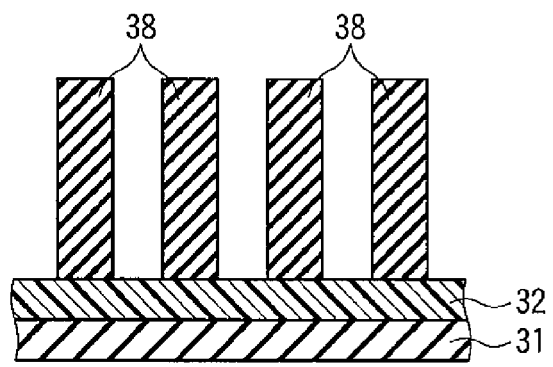
FIG. 11 is a sectional view showing a step next to the step shown in FIG. 10.

Oxygen plasma treatment is carried out to selectively remove the polymer pattern to expose the undercoat layer 32 as shown in FIG. 11. The etching-resistant region 38 is used as an etching mask to process the undercoat layer 32 by etching as shown in FIG. 12. The processed undercoat layer 32 and the etching-resistant region 38 are used as a mask to process the substrate 31 by etching as shown in FIG. 13. The etching gas used in each processing step may be properly selected according to the subject to be processed.

After the pattern is transferred to the surface of the substrate, the substrate is washed with a solvent which satisfactorily dissolves the etching-resistant region to remove the etching-resistant region 38 together with the undercoat layer 32 as shown in FIG. 14. As mentioned above, no particular limitation is imposed on the solvent to be used here, and an appropriate solvent may be selected from solvents which can dissolve the undercoat layer satisfactorily corresponding to the material of the undercoat layer.

According to the pattern forming method in this embodiment, the edge roughness and size variation of the produced polymer pattern are small. When, for example, this pattern forming method is applied to the production of a patterned media, a recording/reproduction head can be registered with high accuracy when it is registered with a pattern. When this pattern forming method is applied to high-density recording media or highly integrated electronic parts, the substantial number of steps can be reduced, bringing about remarkable industrial benefits.

Embodiments of the present invention will be explained in more detail by examples, which are, however, not intended to be limiting of the present invention.

Example 1

A compound represented by the following chemical formula (1) was prepared as a first homopolymer. A compound represented by the following chemical formula (2) was prepared as a second homopolymer.

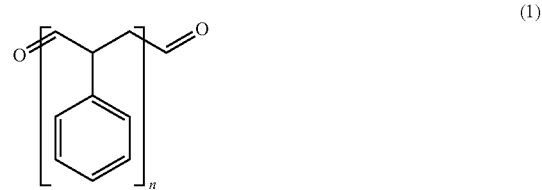

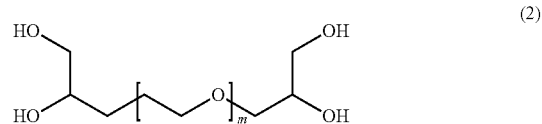

In the above chemical formula, n denotes the degree of polymerization of polystyrene and m denotes the degree of polymerization of polyethylene oxide. As shown in the chemical formula, the first homopolymer is a polystyrene having a carbonyl group as a bonding group at its terminals, and it has a weight average molecular weight of about 20,000. Further, the second homopolymer is a polyethylene oxide having a diol group as a bonding group at its terminals and has a weight average molecular weight of about 11,000.

The first homopolymer and the second homopolymer were mixed in a ratio by weight of 1:1. Further, tris(4-methylphenyl)sulfoniumtrifluoromethane sulfonate was added as a photoacid generator. The amount of the photoacid generator was about 50% of the weight of the polystyrene having a carbonyl group at its terminals. 1,4-dioxane and water were mixed in a ratio by volume of 1:1 to prepare a mixed solvent. The above mixture was dissolved in this mixed solvent to prepare a blend polymer solution. The concentration of the polymers in the solution was made to be about 1% by weight.

In this stage, a carbonyl group of the first homopolymer and the diol of the second homopolymer were dehydration-condensed to form an acetal. A block copolymer thus obtained is represented by the following chemical formula.

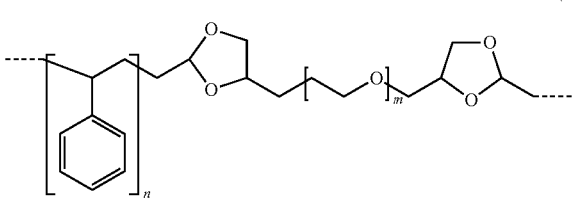

(3)

The blend polymer solution was coated on the surface of a silicon substrate by the spin coating method to form a coating film. Before coating, the surface of the silicon substrate was modified using a random copolymer of polystyrene-polymethylmethacrylate (polystyrene 25%/polymethylmethacrylate 75%) according to the aforementioned method. This ensures the vertical arrangement of the block polymer.

After the coating, the coating film was subjected to heat treatment performed at 184° C. for about 3 hours to form a microphase-separated structure in the polymer film. After that, a low-pressure mercury UV lamp was used as a light source to irradiate the polymer film with light. An acid was generated from the photoacid generator, whereby the acetal bond connecting the first polymer chain with the second polymer chain was broken.

The polyethylene oxide domains were selectively dissolved and removed by washing the polymer film with water after the light irradiation and the polystyrene domains which were each vertically arranged with respect to the substrate were left to form a polymer pattern.

In order to evaluate edge roughness, the dot size dispersion of this polymer pattern was evaluated by the half value width of the distribution obtained in the measurement of TEM, to find that it was about 7%.

For comparison, a polymer pattern was formed in the same method as above except that a copolymer of polystyrene and polyethylene oxide (65:35) was used. The weight average molecular weight of the copolymer used here was about 30,000. The dot size dispersion of the obtained polymer pattern ranged to 10%.

In Example 1, it was confirmed that the ordered array pattern was improved in orderliness.

In the production of electronic devices and recording mediums, many of the cases where the ordered structure is not constant pose a large problem. When it is considered to apply this polymer pattern to, for example, the above patterned media, this inconstant ordered structure is a cause of jitter noises of a reproduced signal or deviation from an alignment mark, with the result that recording/reproduction at a high signal-to-noise ratio cannot be attained.

Example 2

A polymer pattern formed in the same manner as in the aforementioned Example 1 was used as a template to produce a patterned media of a magnetic body.

A CoCrPt alloy thin film with 5 nm in thickness was formed on a glass substrate by sputtering deposition. A polymer pattern made of polystyrene was formed on the obtained alloy thin film in the same method as in the above Example 1. Spin-on-glass (SOG) was filled in spaces between polymer patterns to form etching-resistant regions.

Oxygen plasma treatment was carried out to selectively remove the polymer pattern made of polystyrene to leave an etching-resistant region made of SOG. This etching-resistant region was used as a mask to carry out argon ion milling. The pattern was transferred by etching the CoCrPt film in this manner to produce a patterned media.

It was confirmed that the size dispersion of the formed dots was about 8% of the dot size and that an ordered array was formed with high accuracy even if the substrate was processed.

Example 3

A compound represented by the following chemical formula (4) was prepared as a first homopolymer. A compound represented by the following chemical formula (5) was prepared as a second homopolymer.

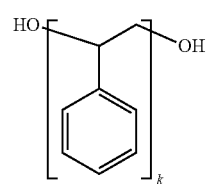

(4)

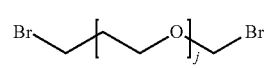

(5)

In the above chemical formula, k denotes the degree of polymerization of polystyrene and j denotes the degree of polymerization of polyethylene oxide. As shown in the chemical formula, the first homopolymer is polystyrene having a hydroxyl group as a bonding group at its terminals, and it has a weight average molecular weight of about 20,000. Further, the second homopolymer is polyethylene oxide having a Br atom as a bonding group at its terminals and has a weight average molecular weight of about 11,000. A halogen atom other than the Br atom may be introduced at the terminals of the second homopolymer as a bonding group.

The first homopolymer and the second homopolymer were mixed in a ratio by weight of 1:1. Further, tris(4-methylphenyl)sulfoniumtrifluoromethane sulfonate was added as a photoacid generator. The amount of the photoacid generator was about 50% of the weight of the polystyrene having a hydroxyl group at its terminals. 1,4-dioxane and water were mixed in a ratio by volume of 1:1 to prepare a mixed solvent. The above mixture was dissolved in this mixed solvent to prepare a blend polymer solution. The concentration of the polymers in the solution was about 1% by weight.

In this stage, the hydroxyl group of the first homopolymer and the Br atom of the second homopolymer underwent an $S_N 2$ reaction by a nucleophilic reaction by the hydroxyl group to form an ether bond. A block copolymer thus obtained is represented by the following chemical formula.

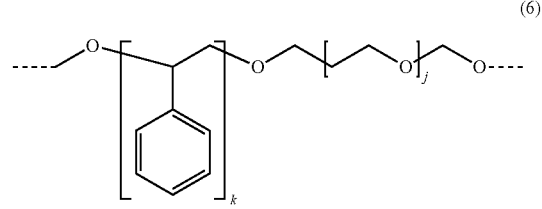

(6)

The blend polymer solution was applied to the surface of a silicon substrate by the spin coating method to form a coating film. Before coating, the surface of the silicon substrate was modified using a random copolymer of polystyrene-polymethylmethacrylate according to the aforementioned method. This ensures the vertical arrangement of the block polymer.

After the coating, the coating film was subjected to heat treatment performed at 180° C. for about 24 hours to form a microphase-separated structure in the polymer film. After that, a low-pressure mercury UV lamp was used as a light source to irradiate the polymer film with light. An acid was generated from the photoacid generator, whereby the ether bond connecting the first polymer chain with the second polymer chain was broken.

The polyethylene oxide domains were selectively dissolved and removed by washing the polymer film with water after the light irradiation and the polystyrene domains which were each vertically arranged with respect to the substrate were left to form a polymer pattern.

The dot size dispersion of this polymer pattern was evaluated in the same method as in Example 1, to find that it was about 7%.

Example 4

A polymer pattern formed in the same manner as in the aforementioned Example 3 was used as a template to produce a patterned media of a magnetic body.

A CoCrPt alloy thin film with 5 nm in thickness was formed on a glass substrate by sputtering deposition. A polymer pattern made of polystyrene was formed on the obtained alloy thin film in the same method as in the above Example 3. Spin-on-glass (SOG) was filled in spaces between polymer patterns to form etching-resistant regions.

Oxygen plasma treatment was carried out to selectively remove the polymer pattern made of polystyrene to leave an etching-resistant region made of SOG. This etching-resistant region was used as a mask to carry out argon ion milling. The pattern was transferred by etching the CoCrPt film in this manner to produce a patterned media.

It was confirmed that the size dispersion of the formed dots was about 8% of the dot size and that an ordered array was formed with high accuracy even if the substrate was processed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method comprising:
   forming, on a substrate, a coating film comprising a mixture of a hydrophilic first homopolymer and a hydrophobic second homopolymer, the hydrophilic first homopolymer having a first bonding group at its terminal, the hydrophobic second homopolymer having a second bonding group at its terminal, the second bonding group being capable of bonding with the first bonding group;
   forming a bond between the first bonding group and the second bonding group to produce a block copolymer comprising the first and second homopolymers, the bond between the first bonding group and the second bonding group being capable of breaking by applying at least one stimulation selected from the group consisting of an acid, a base, light and heat;
   heating the coating film to microphase-separate the block copolymer into a hydrophilic domain comprising the first homopolymer and a hydrophobic domain comprising the second homopolymer, the hydrophilic domain and the hydrophobic domain being arranged alternately side by side;
   breaking the bond, which is present between the hydrophilic domain and the hydrophobic domain; and
   forming a remainder domain by selectively dissolving and removing either the hydrophilic domain or the hydrophobic domain using a solvent to provide a polymer pattern.

2. The method according to claim 1, wherein the at least one stimulation comprises acid and the bond is selected from the group consisting of an acetal bond formed by the reaction between a carbonyl group and an alcohol or diol, ether bond formed by the reaction between a hydroxyl group and methoxymethyl ether chloride, silyl ether bond formed by the reaction between a hydroxyl group and silyl chloride derivative, ester bond formed by the reaction between a carboxyl group and an alcohol, and amide bond formed by the reaction between an amino group and a carboxl group.

3. The method according to claim 1, wherein the at least one stimulation comprises base and the bond is an ester bond formed by the reaction between a hydroxyl group and acetic acid anhydride derivative or benzoyl chloride derivative.

4. The method according to claim 1, wherein the heating is carried out at a temperature T2 satisfying the following relationship:

$$T1<T2<T3$$

where T1 represents a temperature at which the first bonding group is bonded with the second bonding group and T3 represents a temperature at which the bond is thermally broken.

5. The method according to claim 1, further comprising forming an undercoat layer on a surface of the substrate before forming the coating film.

6. The method according to claim 5, wherein the undercoat layer is formed using a polymer having a hydroxyl group at its terminal.

7. The method according to claim 1, further comprising etching the substrate using the polymer pattern as an etching mask.

8. The method according to claim 1, further comprising:
   forming an etching-resistant region on the substrate by filling the hollow area of the polymer pattern with a material having high etching resistance;
   removing the polymer pattern; and
   etching the substrate using the etching-resistant region as an etching mask.

9. The method according to claim 8, wherein the polymer pattern is removed by oxygen plasma treatment.

10. A pattern forming method comprising:
    forming, on a substrate, a coating film comprising a mixture of a hydrophilic first homopolymer and a hydrophobic second homopolymer, the hydrophilic first homopolymer having first bonding groups at its terminals, the hydrophobic second homopolymer having second bonding groups at its terminals, the second bonding groups being capable of bonding with the first bonding groups;
    forming bonds between the first bonding groups and the second bonding groups to produce a block copolymer comprising the first and second homopolymers, the bonds between the first bonding groups and the second bonding groups being capable of breaking by applying at least one stimulation selected from the group consisting of an acid, a base, light and heat;

heating the coating film to microphase-separate the block copolymer into hydrophilic domains comprising the first homopolymer and hydrophobic domains comprising the second homopolymer, of the hydrophilic domains and the hydrophobic domains being arranged alternately side by side;

breaking the bonds, which are present between the hydrophilic domain and the hydrophobic domain; and forming a remainder domain by selectively dissolving and removing either the hydrophilic domains or the hydrophobic domains using a solvent to provide a polymer pattern.

11. The method according to claim 10, wherein the at least one stimulation comprises acid and the bonds are selected from the group consisting of an acetal bond formed by the reaction between a carbonyl group and an alcohol or diol, ether bond formed by the reaction between a hydroxyl group and methoxymethyl ether chloride, silyl ether bond formed by the reaction between a hydroxyl group and silyl chloride derivative, ester bond formed by the reaction between a carboxyl group and an alcohol, and amide bond formed by the reaction between an amino group and a carboxyl group.

12. The method according to claim 10, wherein the at least one stimulation comprises base and the bonds are an ester bond formed by the reaction between a hydroxyl group and acetic acid anhydride derivative or benzoyl chloride derivative.

13. The method according to claim 10, wherein the heating is carried out at a temperature $T2$ satisfying the following relationship:

$$T1<T2<T3$$

where $T1$ represents a temperature at which the first bonding groups are bonded with the second bonding groups and $T3$ represents a temperature at which the bonds are thermally broken.

14. The method according to claim 10, further comprising forming an undercoat layer on a surface of the substrate before forming the coating film.

15. The method according to claim 14, wherein the undercoat layer is formed using a polymer having a hydroxyl group at its terminal.

16. The method according to claim 10, further comprising etching the substrate using the polymer pattern as an etching mask.

17. The method according to claim 10, further comprising:
forming an etching-resistant region on the substrate by filling the hollow area of the polymer pattern with a material having high etching resistance;
removing the polymer pattern; and
etching the substrate using the etching-resistant region as an etching mask.

18. The method according to claim 17, wherein the polymer pattern is removed by oxygen plasma treatment.

* * * * *